United States Patent
Chang et al.

(10) Patent No.: US 8,941,579 B2
(45) Date of Patent: Jan. 27, 2015

(54) DRIVING UNIT AND GATE DRIVER CIRCUIT

(71) Applicant: HannStar Display Corp., New Taipei (TW)

(72) Inventors: Hsien-Cheng Chang, Changhua County (TW); Chih-Yang Yen, Tainan (TW)

(73) Assignee: HannStar Display Corp., Wugu Dist. New Taipei (TW)

( * ) Notice: Subject to any disclaimer, the term of this patent is extended or adjusted under 35 U.S.C. 154(b) by 0 days.

(21) Appl. No.: 14/275,872

(22) Filed: May 12, 2014

(65) Prior Publication Data
US 2014/0340126 A1 Nov. 20, 2014

(30) Foreign Application Priority Data
May 16, 2013 (CN) .......................... 2013 1 0182513

(51) Int. Cl.
*G09G 3/36* (2006.01)
*G11C 19/28* (2006.01)

(52) U.S. Cl.
USPC ............................. 345/100; 345/98; 377/64

(58) Field of Classification Search
USPC ....................... 345/98, 100; 377/64
See application file for complete search history.

(56) References Cited

U.S. PATENT DOCUMENTS

| 7,120,221 | B2 * | 10/2006 | Moon ............................. 377/64 |
| 7,633,477 | B2 * | 12/2009 | Jang et al. ....................... 345/92 |
| 7,664,218 | B2 * | 2/2010 | Tobita ............................. 377/64 |
| 8,305,330 | B2 * | 11/2012 | Fang et al. .................... 345/100 |
| 2005/0156858 | A1 | 7/2005 | Ahn |
| 2010/0259530 | A1 | 10/2010 | Chang |

FOREIGN PATENT DOCUMENTS

TW           I280553           5/2007

* cited by examiner

*Primary Examiner* — Kenneth B. Wells
(74) *Attorney, Agent, or Firm* — Winston Hsu; Scott Margo

(57) ABSTRACT

The present invention discloses a gate driver circuit. The gate driver circuit includes a plurality of driving units electrically connected in series, wherein the gate driver circuit receives a plurality of frequency signals and the driving units transmit a plurality of output signals sequentially. Furthermore, each driving unit includes a primary circuit, a first voltage regulator circuit and a second voltage regulator circuit.

10 Claims, 6 Drawing Sheets

DRIVING UNIT AND GATE DRIVER CIRCUIT

BACKGROUND OF THE INVENTION

1. Field of the Invention

The present invention relates to a driving unit and a gate driver circuit, and more particularly, to a driving unit and a gate driver circuit including a voltage regulator circuit.

2. Description of the Prior Art

Liquid crystal display includes a gate driver circuit and a source electrode driver circuit for dominating the operation of pixels and displaying images, wherein the gate driver circuit is used to transmit signals to each column of pixels, so as to turn on the thin film transistor in each column of the pixels. As increasing development of the liquid crystal display, an integrated gate drive (IGD) circuit having bidirectional operation has been provided at present. However, due to the lack of a voltage regulator circuit, the integrated gate drive circuit may lead to increased noise and further results in dysfunction and bias distortion of the integrated gate drive circuit, after the liquid crystal display has been worked for a period of time. Therefore, the liquid crystal display may no longer function properly and regularly.

SUMMARY OF THE INVENTION

It is one of the objectives of the present invention to provide a driving unit and a gate driver circuit, so that the gate driver circuit can function properly and regularly.

To achieve the purposes described above, the present invention provides a driving unit comprising a primary circuit, a first voltage regulator circuit and a second voltage regulator circuit. The primary circuit includes a first switch comprising a control terminal receiving a first input signal, a first terminal receiving the first input signal and a second terminal coupled with a first node; a second switch comprising a control terminal receiving a second input signal, a first terminal coupled with the first node and a second terminal coupled with a low voltage source; a third switch comprising a control terminal receiving a third input signal, a first terminal receiving the third input signal and a second terminal coupled with the first node; a fourth switch comprising a control terminal receiving a fourth input signal, a first terminal coupled with the first node and a second terminal coupled with the low voltage source; a fifth switch comprising a control terminal coupled with the first node, a first terminal receiving a frequency signal and a second terminal transmitting an output signal; and a capacitor coupled between the control terminal and the second terminal of the fifth switch. The first voltage regulator circuit includes a sixth switch comprising a control terminal receiving a first voltage regulation signal, a first terminal receiving the first voltage regulation signal and a second terminal coupled with a second node; a seventh switch comprising a control terminal coupled with the first node, a first terminal coupled with the second node and a second terminal coupled with the lower voltage source; an eighth switch comprising a control terminal receiving a second voltage regulation signal, a first terminal coupled with the second node and a second terminal coupled with the lower voltage source; a ninth switch comprising a control terminal coupled with the second node, a first terminal coupled with the first node and a second terminal coupled with the lower voltage source; and a tenth switch comprising a control terminal coupled with the second node, a first terminal coupled with the second terminal of the fifth switch and a second terminal coupled with the lower voltage source. The second voltage regulator circuit includes an eleventh switch comprising a control terminal receiving the second voltage regulation signal, a first terminal receiving the second voltage regulation signal and a second terminal coupled with a third node; a twelfth switch comprising a control terminal coupled with the first node, a first terminal coupled with the third node and a second terminal coupled with the low voltage source; a thirteenth switch comprising a control terminal receiving the first voltage regulation signal, a first terminal coupled with the third node and a second terminal coupled with the low voltage source; a fourteenth switch comprising a control terminal coupled with the third node, a first terminal coupled with the first node and a second terminal coupled with the low voltage source; and a fifteenth switch comprising a control terminal coupled with the third node, a first terminal coupled with the second terminal of the fifth switch and a second terminal coupled with the low voltage source.

To overcome the aforementioned issues, the present invention provides a gate driver circuit. The gate driver circuit includes a plurality of driving units electrically connected in series, wherein the gate driver circuit receives a plurality of frequency signals and the driving units transmit a plurality of output signals sequentially.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
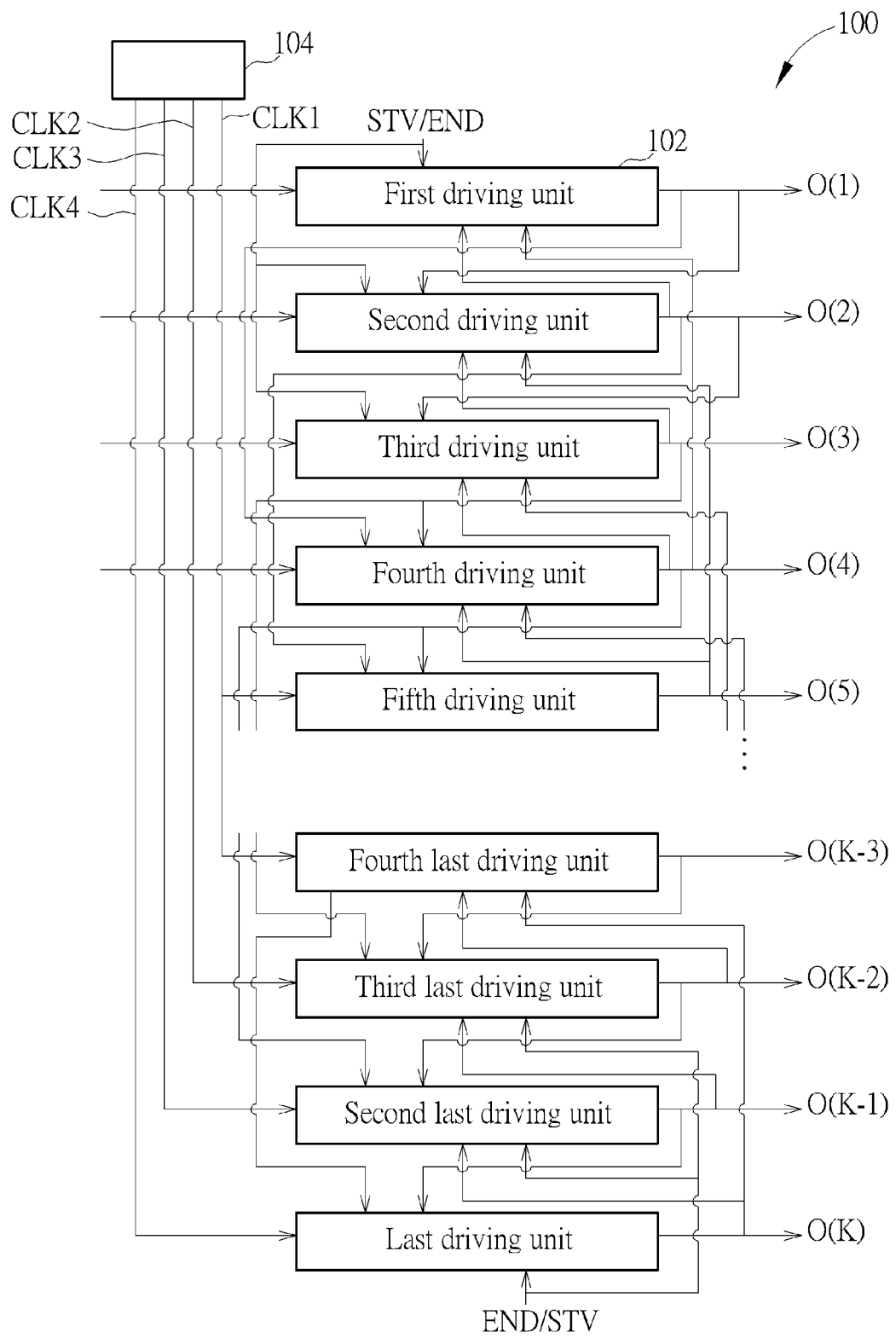
FIG. 1 is a block diagram illustrating a gate driver circuit in accordance with one embodiment of the present invention.
Figure 2:
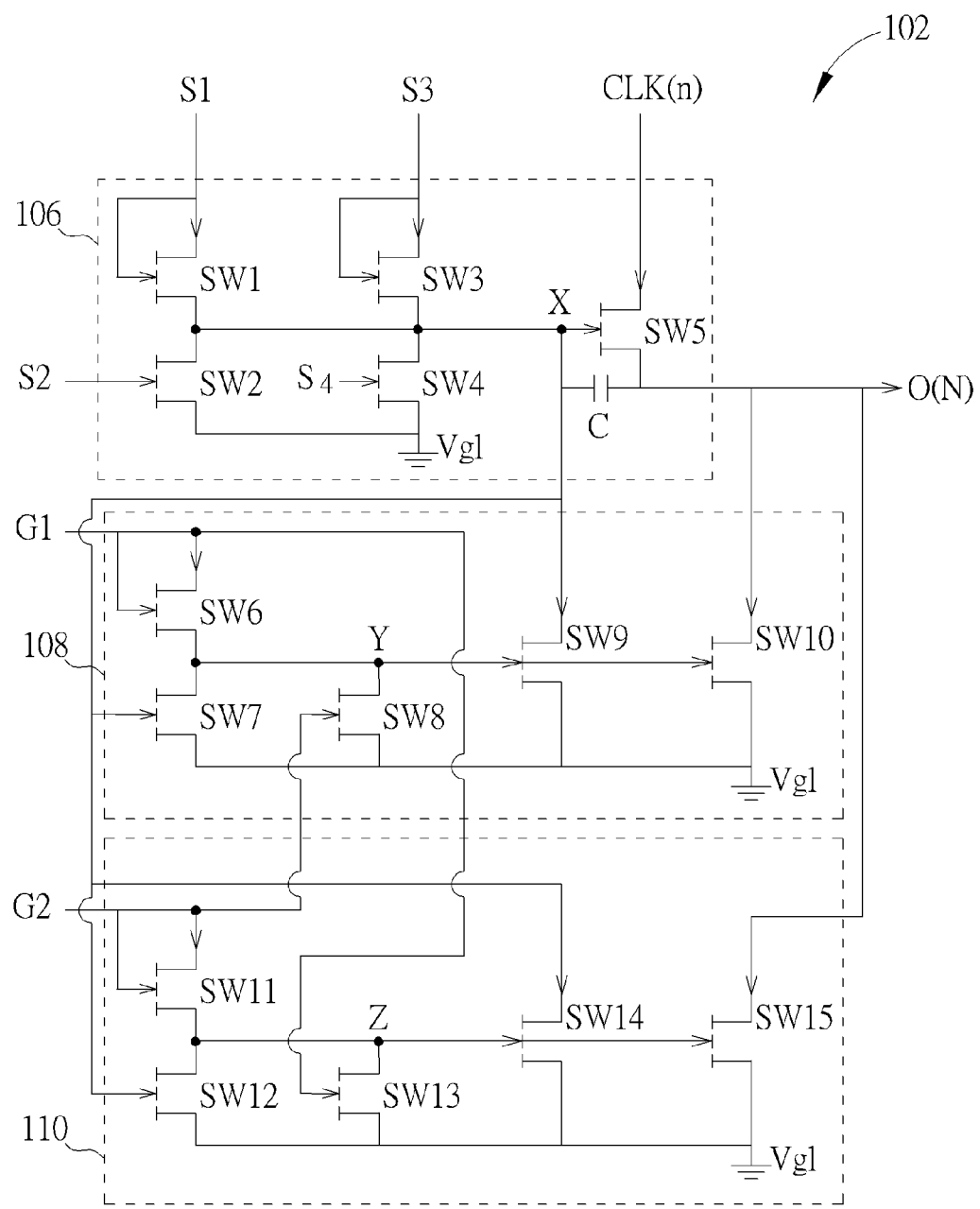
FIG. 2 is a circuit diagram illustrating a driving unit of the gate driver circuit in accordance with one embodiment of the present invention.

Referring to FIG. 1 and FIG. 2, FIG. 1 is a block diagram illustrating a gate driver circuit in accordance with one embodiment of the present invention, and FIG. 2 is a circuit diagram illustrating a driving unit of the gate driver circuit in accordance with this embodiment of the present invention. As shown in FIG. 1, the gate driver circuit 100 of the present embodiment includes a plurality of driving units 102 electrically connected in series in order. Also, the driving units 102 can receive a plurality of frequency signals CLK generated from a frequency generator 104. For example, a number of the frequency signals CLK can be four, such as a first frequency signal CLK1, a second frequency signal CLK2, a third frequency signal CLK3, and a fourth frequency signal CLK4, but not limited thereto. Preferably, a number of the frequency signals of the present invention can be between three and eight, but not limited thereto. Through the gate driver circuit 100 sequentially receiving the frequency signals, each of the driving units 102 can transmit a plurality of output signals O(1) to O(K) respectively, wherein the "K" refers to a number of the driving units 102. In the present invention, the gate driver circuit 100 can optionally include the frequency generator 104, but not limited thereto.

As shown in FIG. 2, each of the driving units 102 include a primary circuit 106, a first voltage regulator circuit 108 and a second voltage regulator circuit 110. In the present embodiment, an Nth driving unit 102 is used as an example, wherein the "N" can refers to any positive integer more than 0 and less than or equal to "K", namely, the Nth driving unit 102 can be any one of the driving units. In the present embodiment, the primary circuit 106 includes a first switch SW1, a second switch SW2, a third switch SW3, a fourth switch SW4, a fifth switch SW5 and a capacitor C.

The first switch SW1 includes a control terminal receiving a first input signal S1, a first terminal receiving the first input signal S1 and a second terminal coupled with a first node X; the second switch SW2 includes a control terminal receiving a second input signal S2, a first terminal coupled with the first node X and a second terminal coupled with a low voltage source Vgl, such as a ground terminal; a third switch SW3 includes a control terminal receiving a third input signal S3, a first terminal receiving the third input signal S3 and a second terminal coupled with the first node X; a fourth switch SW4 includes a control terminal receiving a fourth input signal S4, a first terminal coupled with the first node X and a second terminal coupled with the low voltage source Vgl; a fifth switch SW5 includes a control terminal coupled with the first node X, a first terminal receiving a frequency signal CLK(n) and a second terminal transmitting an output signal O(N); and the capacitor C coupled between the control terminal and the second terminal of the fifth switch SW5.

A first voltage regulator circuit 108 includes a sixth switch SW6, a seventh switch SW7, an eighth switch SW8, a ninth switch SW9, and a tenth switch SW10. The sixth switch SW6 includes a control terminal receiving a first voltage regulation signal G1, a first terminal receiving the first voltage regulation signal G1 and a second terminal coupled with a second node Y; the seventh switch SW7 includes a control terminal coupled with the first node X, a first terminal coupled with the second node Y and a second terminal coupled with the lower voltage source Vgl; the eighth switch SW8 includes a control terminal receiving a second voltage regulation signal G2, a first terminal coupled with the second node Y and a second terminal coupled with the lower voltage source Vgl; the ninth switch SW9 includes a control terminal coupled with the second node Y, a first terminal coupled with the first node X and a second terminal coupled with the lower voltage source Vgl; and the tenth switch SW10 includes a control terminal coupled with the second node Y, a first terminal coupled with the second terminal of the fifth switch SW5 and a second terminal coupled with the lower voltage source Vgl.

The second voltage regulator circuit 110 includes an eleventh switch SW11, a twelfth switch SW12, a thirteenth switch SW13, a fourteenth switch SW14, and a fifteenth switch SW15. The eleventh switch SW11 includes a control terminal receiving the second voltage regulation signal G2, a first terminal receiving the second voltage regulation signal G2 and a second terminal coupled with a third node Z; the twelfth switch SW12 includes a control terminal coupled with the first node X, a first terminal coupled with the third node Z and a second terminal coupled with the low voltage source Vgl; the thirteenth switch SW13 includes a control terminal receiving the first voltage regulation signal G1, a first terminal coupled with the third node Z and a second terminal coupled with the low voltage source Vgl; the fourteenth switch SW14 includes a control terminal coupled with the third node Z, a first terminal coupled with the first node X and a second terminal coupled with the low voltage source Vgl; and the fifteenth switch SW15 includes a control terminal coupled with the third node Z, a first terminal coupled with the second terminal of the fifth switch SW5 and a second terminal coupled with the low voltage source Vgl. Furthermore, the first switch SW1, the second switch SW2, the third switch SW3, the fourth switch SW4, the fifth switch SW5, the sixth switch SW6, the seventh switch SW7, the eighth switch SW8, the ninth switch SW9, the tenth switch SW10, the eleventh switch SW11, the twelfth switch SW12, the thirteenth switch SW13, the fourteenth switch SW14 and the fifteenth switch SW15 can include a thin film transistor or other semiconductor switching elements respectively but not limited thereto.

Referring to FIG. 1 and FIG. 2, in further, the first terminal and the control terminal of the first switch SW1 of the Nth driving unit 102 are electrically connected to the second terminal of the fifth switch SW5 of the (N−1)th driving unit 102. In other words, the first input signal S1 is namely the output signal O(N−1) of the (N−1)th driving unit 102. As the "N" refers to 1, since there is no (N−1)th driving unit 102 outputting an output signal, the gate driver circuit 100 will be driven in a forward mode. That is to state that the driving units 102 will be driven according to an order of the driving units 102 connected in series, wherein the first terminal and the control terminal of the first switch SW1 of the first driving unit 102 are electrically connected to a scanning start terminal, and the first input signal S1 is namely a scanning start signal STV in the forward mode. While the gate driver circuit 100 is driven in a reverse mode, stating that the driving units 102 are driven according to a reverse order of the driving units 102 connected in series. Therefore, the first terminal and the control terminal of the first switch SW1 of the first driving unit 102 are electrically connected to a scanning terminal, and the first input signal S1 is namely a scanning terminal signal END in the reverse mode.

The control terminal of the second switch SW2 of the Nth driving unit 102 is electrically connected to the second terminal of the fifth switch SW5 of the (N+M)th driving unit 102, wherein the "M" refers to a positive integer in a range of more than 1 and less than the number of the frequency signals. In other words, the second input signal S2 is namely the output signal O(N+M) of the (N+M)th driving unit 102. When the "N" is more than (K−M), since there is no (K+1)th driving unit 102 to the (K−M)th driving unit 102 outputting output signals, the control terminals of the second switches SW2 of the Mth from the last driving unit 102 to the last driving unit 102 are electrically connected to the scanning terminal, and the second input signal S2 will be the scanning terminal signal END, while the gate driver circuit 100 is driven in the forward mode. On the other hand, while the gate driver circuit 100 is driven in the reverse mode, the control terminals of the second switches SW2 of the Mth from the last driving unit 102 to the last driving unit 102 are electrically connected to the scanning start terminal, and the second input signal S2 will be the scanning start signal STV in the reverse mode.

The first terminal and the control terminal of the third switch SW3 in the Nth driving unit 102 are electrically connected to the second terminal of the fifth switch SW5 in the (N+1)th driving unit 102. In other words, the third input signal S3 is namely the output signal O(N+1) transmitted from the (N+1)th driving unit 102. As the "N" refers to K, since there is no (K+1)th driving unit 102 outputting an output signal, the first terminal and the control terminal of the third switch SW3 of the last driving unit 102 are electrically connected to the scanning terminal, and the third input signal S3 will be the scanning terminal signal END, while the gate driver circuit 100 is driven in the forward mode. On the other hand, while the gate driver circuit 100 is driven in the reverse mode, the first terminal and the control terminal of the third switch SW3 of the last driving unit 102 are electrically connected to the scanning start terminal and the third input signal S3 will be the scanning start signal STV in the reverse mode.

The control terminal of the fourth switch SW4 in the Nth driving unit 102 is electrically connected to the second terminal of the fifth switch SW5 in the (N−M)th driving unit 102. In other words, the fourth input signal S4 is namely the output signal O(N−M) transmitted from the (N−M)th driving unit 102. As the "N" being less than M, since there is no the (N−M)th driving unit 102 outputting an output signal, the control terminals of the fourth switches SW4 in the first driving unit 102 to the Mth driving unit 102 are electrically connected to the scanning start terminal, and the fourth input signal S4 will be the scanning start signal STV, while the gate driver circuit 100 is driven in the forward mode. On the other hand, while the gate driver circuit 100 is driven in the reverse mode, the control terminals of the fourth switches SW4 in the first driving unit 102 to the Mth driving unit 102 are electrically connected to the scanning terminal and the fourth input signal S4 will be the scanning terminal signal END in the reverse mode.

Figure 3:
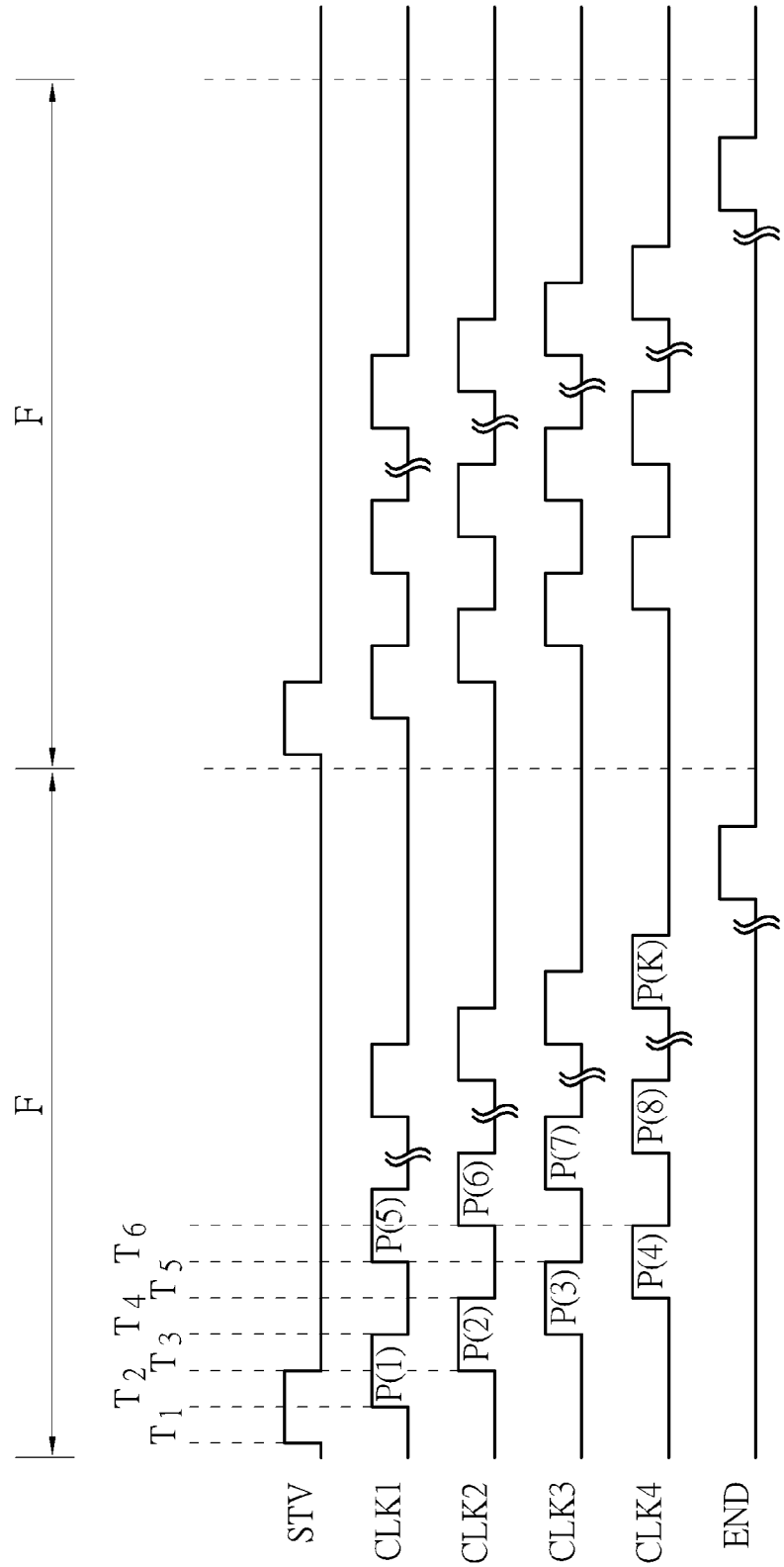
FIG. 3 is a timing sequence diagram illustrating a frequency signal, a scanning start signal, and a scanning terminal signal in accordance with one embodiment of the present invention.

In following paragraphs, the driving method of the gate driver circuit 100 of this embodiment will be detailed. Referring to FIG. 3 and further referring to FIG. 1, FIG. 3 is a timing sequence diagram illustrating the frequency signal, the scanning start signal, and the scanning terminal signal according to this embodiment of the present invention. As shown in FIG. 1 and FIG. 3, the gate driver circuit 100 is driven in the forward mode in this embodiment. Also, the four frequency signals, CLK1, CLK2, CLK3 and CLK4, are used as an example in the present embodiment, but not limited thereto. In the present embodiment, the first frequency signal CLK1, the second frequency signal CLK2, the third frequency signal CLK3 and the fourth frequency signal CLK4 include a plurality of pulses P(N) generated sequentially in a frame period F, and each pulse P(N) of the first frequency signal CLK1, each pulse P(N) of the second frequency signal CLK2, each pulse P(N) of the third frequency signal CLK3 and each pulse P(N) of the fourth frequency signal CLK4 are generated sequentially. The generated pulses P(N) are sequentially transmitted to the driving units 102 respectively in different times. Among them, any two pulses P(N), P(N+4) adjacent to each other and generated by each of the frequency signals CLK(n) have a fourth phase difference therebetween, and the fourth phase difference is greater than a third phase difference between the Nth pulse P(N) and the (N+3)th pulse P(N+3), a second phase difference between the Nth pulse P(N) and the (N+2)th pulse P(N+2), and a first phase difference between the Nth pulse P(N) and the (N+1)th pulse P(N+1). In the present embodiment, the first phase difference is less than a width of each pulse P(N). In other words, the pulses P(N), P(N+1), which are transmitted to any two of the driving units 102 adjacent to each other, are partially overlapped with each other. Therefore, each of the driving units 102 can receive a pulse with a longer time, and each output signal O(N) of each driving unit 102 will be prolonged. Accordingly, each column of the pixels can obtain enough time for display an image, and the present invention is not limited thereto. Further, the scanning start signal STV is transmitted before the transmitting of the frequency signals, and the scanning terminal signal END is transmitted after the transmitting the frequency signals in the entire frame period F. That is to state that the pulse of the scanning start signal STV is transmitted earlier than the transmitting of the first pulse P(1) generated by the first frequency signal CLK1. On the other hand, the scanning terminal signal END is transmitted later than the last pulse P(K) generated by the fourth frequency signal CLK4, and the scanning terminal signal END is not overlapped with the last pulse P(K) of the fourth frequency signal CLK4, but not limited thereto.

As an example, in each frame period F, the scanning start signal STV generates and transmits a pulse to a corresponding driving unit 102 in a first time period T1.

Then, in a second time period T2, the scanning start signal STV remains at a high level, and the first frequency signal CLK1 provides a first pulse P(1) to the first driving unit 102.

Next, in a third time period T3, the first frequency signal CLK1 still remains at the high level, and the second frequency signal CLK2 provides a second pulse P(2) to the second driving unit 102.

After that, in a fourth time period T4, the first frequency signal CLK1 is converted to a low level, and the second frequency signal CLK2 still remains at the high level. Also, the third frequency signal CLK3 provides a third pulse P(3) to the third driving unit 102.

Then, in a fifth time period T5, the second frequency signal CLK2 is converted to the low level, and the third frequency signal CLK3 still remains at the high level. Also, the fourth frequency signal CLK4 provides a fourth pulse P(4) to the fourth driving unit 102.

As following, in a sixth time period T6, the third frequency signal CLK3 is converted to the low level, and the fourth frequency signal CLK4 remains at the high level.

Moreover, the first frequency signal CLK1 provides a fifth pulse P(5) to the fifth driving unit 102. The rest can be done through said manner, the pulses P(4N+1) generated by the first frequency signal CLK1, the pulses P(4N+2) generated by the second frequency signal CLK2, the pulses P(4N+3) generated by the third frequency signal CLK3, and the pulses P(4N+3) generated by the fourth frequency signal CLK4 are sequentially provided to the (4N+1)th, the (4N+2)th, the (4N+3)th, and the (4N+4)th driving units 102 respectively. With such performance, the thin film transistors in columns of the pixels can be sequentially turned on by transmitting each generated pulse to each column of pixels. If digital signals can be also transmitted to the pixels, the entire frame can be displayed on a display panel including the gate driver circuit 100 of the present invention. In the present invention, the pulses P(N), P(N+1) respectively transmitted to any two of the driving units 102 adjacent to each other are not limited to be overlapped with each other. In other embodiment of the present invention, the pulses P(N), P(N+1) respectively transmitted to any two of the driving units can be not overlapped with each other.

Figure 4:
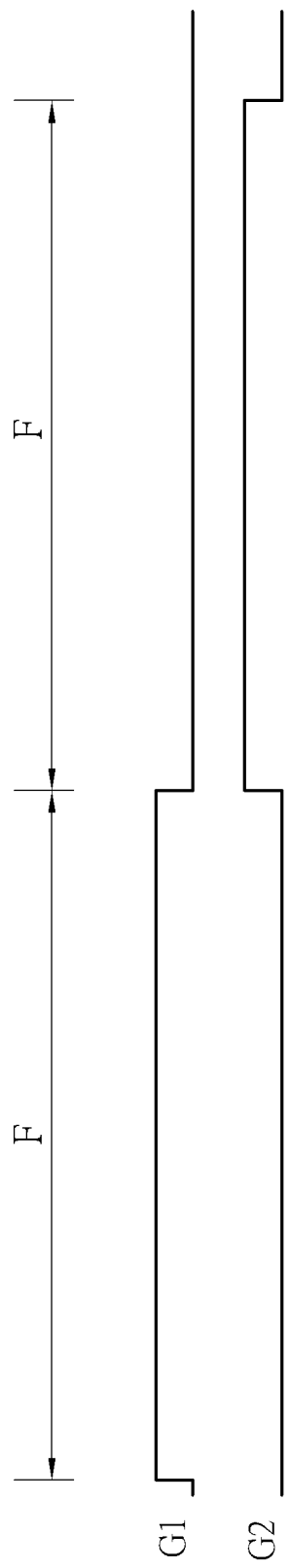
FIG. 4 is a timing sequence diagram illustrating a first voltage regulator circuit and a second voltage regulator circuit in accordance with one embodiment of the present invention.

Referring to FIG. 4, FIG. 4 is a timing sequence diagram illustrating the first voltage regulator circuit and the second voltage regulator circuit of one embodiment of the present invention. As shown in FIG. 4, a phase of the first voltage regulation signal G1 is opposite to a phase of the second voltage regulation signal G2. In other words, the phase difference between the first voltage regulation signal G1 and the second voltage regulation signal G2 is 180 degrees. As an example, in one frame period F, the first voltage regulation signal G1 remains at the high level and the second voltage regulation signal G2 remains at the low level. However, turning to next frame period F, the first voltage regulation signal G1 is converted to the low level and the second voltage regulation signal G2 is converted to the high level. In other embodiment of the present invention, the first voltage regulation signal G1 and the second voltage regulation signal G2 can also remain at the high level in other time period, such as, a time period of a half frame.

In the following paragraphs, the driving method of the driving unit 102 are further detailed, the (N)th driving unit and "M" referring to 3 are used as an example, but not limited thereto. Since the aforementioned description has illustrated the situations as the "N" refers to 1 or K, more than (K−M), and less than M, the situations while the "N" refers to 1 or K, more than (K−M), and less than M will not be further detailed in the following description, so as to clearly describe the driving method of the driving unit 102, but the present invention is not limited thereto.

Figure 5:
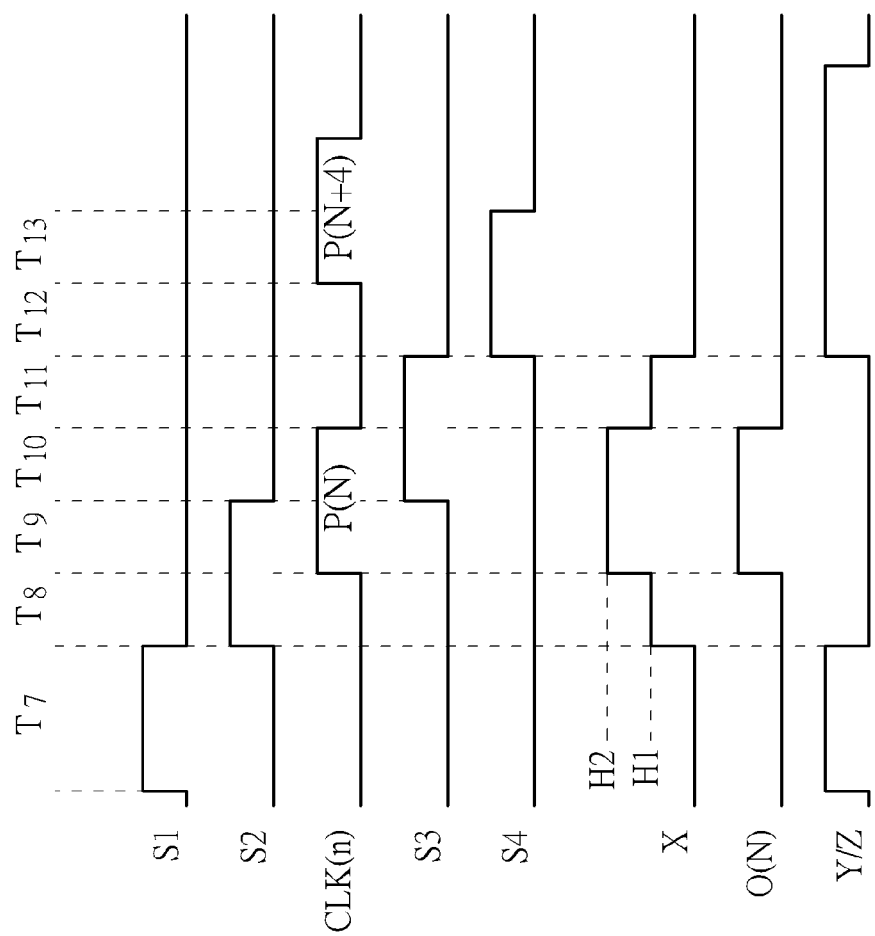
FIG. 5 is a timing sequence diagram illustrating a first input signal, a second input signal, a third input signal, a fourth input signal, a frequency signal, an output signal, and signals of a first node and a second node and a third node in accordance with one embodiment of the present invention.

Referring to FIG. 5, and also referring FIGS. 1-4, FIG. 5 is a timing sequence diagram illustrating the first input signal, the second input signal, the third input signal, the fourth input signal, the frequency signal, the output signal, the first node, and one of the second node and the third node in one embodiment of the present invention. As shown in FIGS. 1-5, the gate driver circuit 100 of this embodiment is driven in a forward mode.

In a seventh time period T7, the fourth input signal S4, namely the output signal O(N−3) of the (N−3)th driving unit 102 is converted to the high level (not shown in the figures), thereby switching on the fourth switch SW4 in the Nth driving unit 102 and discharging the electric potential in the first node X to the low voltage source Vgl. Therefore, the first node X is then converted to the low level, thereby shutting down the fifth switch SW5, and the output signal O(N) transmitted from the Nth driving unit 102 remains at the low level accordingly. On the other hand, the electric potentials of the second node Y or the third node Z also remains at the high level at this time.

Then, in an eighth time period T8, the output signal O(N−3) of the (N−3)th driving unit 102 is converted to the low level (not shown in the figures), and the first input signal S1, namely the output signal O(N−1) of the (N−1)th driving unit 102 is converted to the high level (not shown in the figures), thereby switching on the first switch SW1 in the Nth driving unit 102 and converting the electric potential of the first node X to a first high level H1. Therefore, the fifth switch SW5, and one of the seventh switch SW7 and the twelfth switch SW12 will be switched on. Since one of the seventh switch SW7 and the twelfth switch SW12 is switched on, the electric potential of the second node Y or the third node Z will be discharged accordingly to the low voltage source Vgl. Thus, the second node Y or the third node Z is converted to the low level.

Next, in a ninth time period T9, the frequency signal CLK (n) generates the pulse P(N) and is converted to the high level, thereby converting the output signal O(N) of the Nth driving unit 102 to the high level. Since the capacitor C is coupled between the control terminal and the second terminal of the fifth switch SW5, the electric potential of the first node X will increase with the increasing of the output signal O(N) due to the affection of the capacitive coupling, thereby raising the electric potential of the first node X from the first high level H1 to a second high level H2.

As following, in a tenth time period T10, the output signal O(N−1) of the (N−1)th driving unit 102 is converted to the low level (not shown in the figures) and the third input signal S3, namely the output signal O(N+1) of the (N+1)th driving unit 102 is converted to the high level (not shown in the figures), thereby switching on the third switch SW3 and maintaining the electric potential of the first node X at the second high level H2.

After that, in an eleventh time period T11, the frequency signal CLK(n) is converted to the low level, thereby converting the output signal O(N) of the Nth driving unit 102 to the low level. In this way, the electric potential of the first node X will be discharged with the decreasing of the output signal O(N), thereby being decreased from the second high level H2 to the first high level H1.

Then, in a twelfth time period T12, the output signal O(N+1) of the (N+1)th driving unit 102 is converted to the low level (not shown in the figures), thereby switching off the third switch SW3 and converting the second input signal S2, namely the output signal O(N+3) of the (N+3)th driving unit 102 to the high level (not shown in the figures). Therefore, the second switch SW2 is switched on, and the electric potential of the first node X is discharged to the low level, so as to further charging the electric potential of the second node Y or the third node Z to the high level. Accordingly, the seventh switch SW7 or the twelfth switch SW12 will be switched off. Also, the ninth switch SW9 and the tenth switch SW10, or the fourteenth switch SW14 and the fifteen switch SW15 will be switched on, thereby electrically connecting the output signal O(N) to the low voltage source Vgl. With such performance, the output signal O(N) can be outputted steadily, and keep from interference caused by other pulses. Thus, the step for driving the single driving unit 102 is achieved.

Next, in a thirteenth time period T13, the output signal O(N+3) of the (N+3)th driving unit 102 remains steady at the high level (not shown in the figures), and the frequency signals CLK(n) generates a next pulse P(N+4). It is noted that the second input signal S2, namely the output signal O(N+M) of the (N+M)th driving unit 102, is transmitted to the Nth driving unit 102 prior than the transmitting of the next pulse P(N+4) generated from the frequency signal CLK (n) and transmitted to the Nth driving unit 120. Thus, the output signal O(N) will not be affected by the next pulse P(N+4).

It should not be neglected that each of the driving units 102 in the present embodiment can successfully avoid over discharging the electric potential of the first node X through disposing the capacitor C. Furthermore, each of driving units usually has increased noise and bias distortion issues, when the input signals of the driving units only rely on a signal voltage regulator for a long working period. Hence, each of the driving units 102 in the present embodiment has the first voltage regulator circuit 108 and the second voltage regulator circuit 110 disposed therein, for effectively prevent the output signal from having characteristic distortion and increased noise. Hence, the gate driver circuit of the present embodiment can function properly and regularly for a long period.

Figure 6:
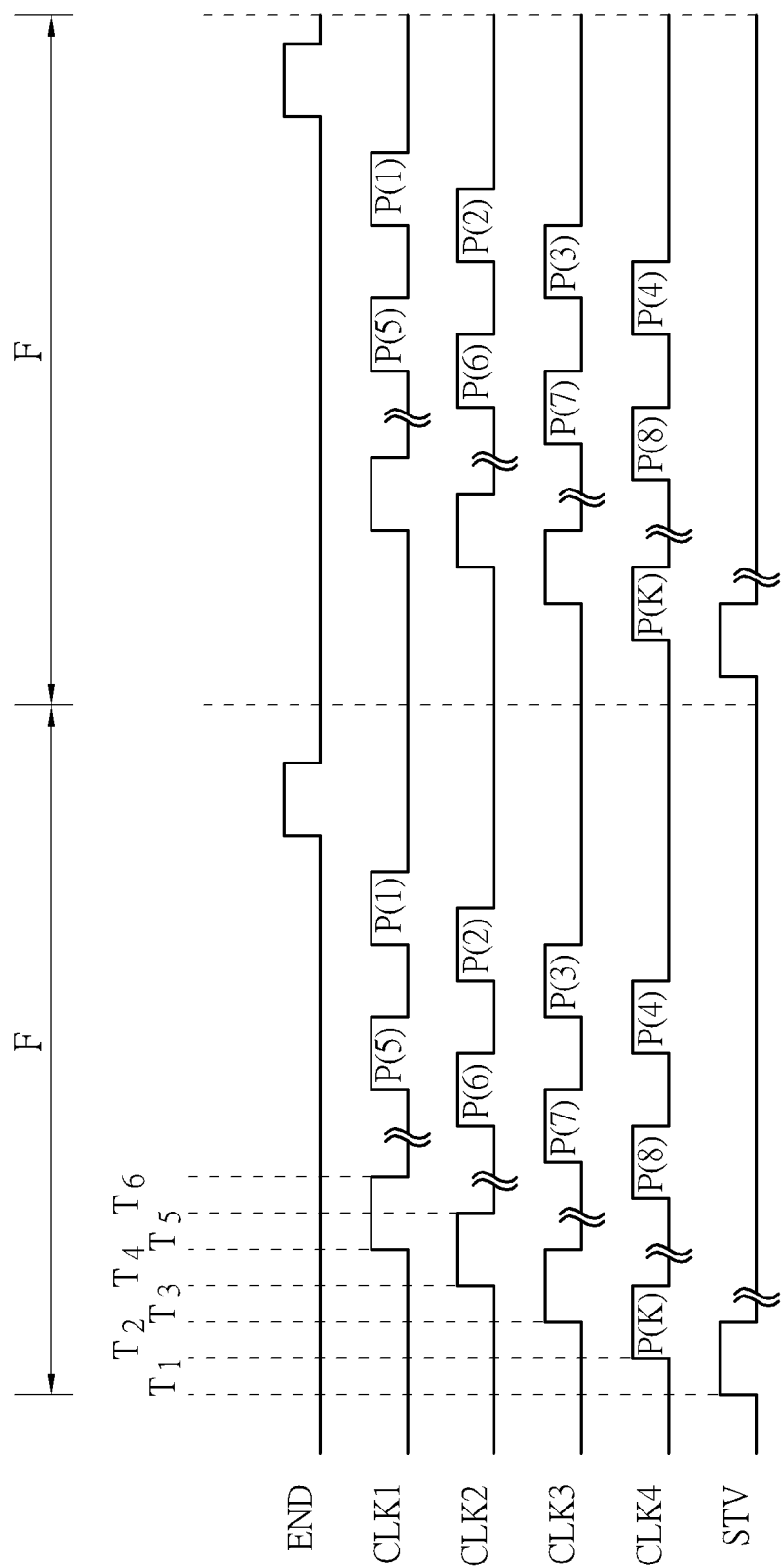
FIG. 6 is a timing sequence diagram illustrating frequency signals, a scanning start signal, and a scanning terminal signal END in accordance with another embodiment of the present invention.

The gate driver circuit of the present invention can also be driven in the reverse mode. Referring to FIG. 6 and further referring to FIG. 1, FIG. 6 is a sequence diagram illustrating a frequency signal, a scanning start signal, and a scanning terminal signal according to another embodiment of the present invention. As shown in FIG. 1 and FIG. 6, the pulses P(N) of the present embodiment are generated by a reverse order, in comparison with the aforementioned embodiment. However, each of the pulse P(N) still corresponds to the same driving units 102 to the aforementioned embodiment. In other words, the driving units 102 for receiving each of the pulses P(N) are connected in series by the same reverse order. For example, a first pulse P(K) generated from the fourth frequency signal CLK4, a second pulse P(K−1) generated from the third frequency signal CLK3, a third pulse P(K−2) generated from the second frequency signal CLK2, and a fourth pulse P(K–3) generated from the first frequency signal CLK1 are provided to the last driving unit 102, the second from the last driving unit 102, the third from the last driving unit 102 and the fourth from the last driving unit 102 respectively, and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving unit, comprising:
   a primary circuit, the primary circuit comprising:
      a first switch, comprising a control terminal receiving a first input signal, a first terminal receiving the first input signal and a second terminal coupled with a first node,
      a second switch, comprising a control terminal receiving a second input signal, a first terminal coupled with the first node and a second terminal coupled with a low voltage source,
      a third switch, comprising a control terminal receiving a third input signal, a first terminal receiving the third input signal and a second terminal coupled with the first node,
      a fourth switch, comprising a control terminal receiving a fourth input signal, a first terminal coupled with the first node and a second terminal coupled to the low voltage source,
      a fifth switch, comprising a control terminal coupled to the first node, a first terminal receiving a frequency signal and a second terminal transmitting an output signal, and
      a capacitor, coupled between the control terminal and the second terminal of the fifth switch;
   a first voltage regulator circuit, comprising:
      a sixth switch, comprising a control terminal receiving a first voltage regulation signal, a first terminal receiving the first voltage regulation signal and a second terminal coupled with a second node,
      a seventh switch, comprising a control terminal coupled with the first node, a first terminal coupled with the second node and a second terminal coupled the lower voltage source,
      an eighth switch, comprising a control terminal receiving a second voltage regulation signal, a first terminal coupled with the second node and a second terminal coupled with the lower voltage source,
      a ninth switch, comprising a control terminal coupled with the second node, a first terminal coupled with the first node and a second terminal coupled with the lower voltage source, and
      a tenth switch, comprising a control terminal coupled with the second node, a first terminal coupled with the second terminal of the fifth switch and a second terminal coupled with the lower voltage source; and
   a second voltage regulator circuit, comprising:
      an eleventh switch, comprising a control terminal receiving the second voltage regulation signal, a first terminal receiving the second voltage regulation signal and a second terminal coupled with a third node,
      a twelfth switch, comprising a control terminal coupled with the first node, a first terminal coupled with the third node and a second terminal coupled with the low voltage source,
      a thirteenth switch, comprising a control terminal receiving the first voltage regulation signal, a first terminal coupled with the third node and a second terminal coupled with the low voltage source,
      a fourteenth switch, comprising a control terminal coupled with the third node, a first terminal coupled with the first node and a second terminal coupled with the low voltage source, and
      a fifteenth switch, comprising a control terminal coupled with the third node, a first terminal coupled with the second terminal of the fifth switch and a second terminal coupled with the low voltage source.

2. The driving unit according to claim 1, wherein a phase of the first voltage regulation signal is opposite to a phase of the second voltage regulation signal.

3. A gate driver circuit, comprising:
   a plurality of driving units of claim 1, an (N–M)th driving unit to an (N–1)th driving unit, an Nth driving unit and an (N+1)th driving unit to an (N+M)th driving unit of the plurality of driving units being electrically connected in series, wherein N is a positive integer more than 0, and M is a positive integer more than 1 but less than a number of the frequency signals.

4. The gate driver circuit according to claim 3, wherein the first terminal and the control terminal of the first switch in the Nth driving unit are electrically connected to the second terminal of the fifth switch in the (N–1)th driving unit.

5. The gate driver circuit according to claim 3, wherein the control terminal of the second switch in the Nth driving unit is electrically connected to the second terminal of the fifth switch in the (N+M)th driving unit.

6. The gate driver circuit according to claim 3, wherein the number of the frequency signals is between 3 and 8.

7. The gate driver circuit according to claim 3, wherein the first terminal and the control terminal of the third switch in the Nth driving unit are electrically connected to the second terminal of the fifth switch in the (N+1)th driving unit.

8. The gate driver circuit according to claim 3, wherein the control terminal of the fourth switch in the Nth driving unit is electrically connected to the second terminal of the fifth switch in the (N–M)th driving unit.

9. The gate driver circuit according to claim 3, wherein each frequency signal includes a plurality of pulses generated sequentially, and each of the pulses generated from each of the frequency signals is transmitted to each of the driving units.

10. The gate driver circuit according to claim 9, wherein the pulses transmitted to any two of the driving units adjacent to each other are overlapped with each other.

* * * * *